United States Patent [19]

Suzawa et al.

[11] Patent Number: 5,719,068

[45] Date of Patent: Feb. 17, 1998

[54] METHOD FOR ANISOTROPIC ETCHING CONDUCTIVE FILM

[75] Inventors: Hideomi Suzawa, Kanagawa; Shunpei Yamazaki, Tokyo; Yasuhiko Takemura, Kanagawa, all of Japan

[73] Assignee: Semiconductor Energy Laboratory Co., Ltd., Kanagawa, Japan

[21] Appl. No.: 562,270

[22] Filed: Nov. 22, 1995

[30] Foreign Application Priority Data

Nov. 25, 1994 [JP] Japan ................. 6-315634

[51] Int. Cl.$^6$ ........................... H01L 21/302
[52] U.S. Cl. ............. 437/44; 156/646.1; 156/643.1; 156/662.1; 216/74
[58] Field of Search .............. 156/643.1, 646.1, 156/662.1, 656.1; 216/63, 74; 437/44

[56] References Cited

U.S. PATENT DOCUMENTS

| | | | |
|---|---|---|---|
| 4,498,953 | 2/1985 | Cook et al. | 156/646 |
| 4,734,158 | 3/1988 | Gillis | 156/646 |
| 4,859,620 | 8/1989 | Wei et al. | 437/44 |
| 4,937,094 | 6/1990 | Doehler et al. | 156/646 |
| 5,147,826 | 9/1992 | Liu et al. | 437/233 |
| 5,275,851 | 1/1994 | Fonash et al. | 427/578 |
| 5,286,331 | 2/1994 | Chen et al. | 156/345 |
| 5,350,480 | 9/1994 | Gray | 156/646 |
| 5,462,635 | 10/1995 | Ono et al. | 156/643.1 |
| 5,498,555 | 3/1996 | Lin | 437/35 |

FOREIGN PATENT DOCUMENTS

| | | |
|---|---|---|
| 01092385 | 4/1989 | Japan . |
| 03163825 | 7/1991 | Japan . |
| 05343363 | 12/1993 | Japan . |

OTHER PUBLICATIONS

"Silicon Processing for the VLSI Era–Process Integration"—vol. 2; Wolf; Lattice Press; Sunset Beach, Ca; ©1990; pp. 354–357.

"Si and Al Etching and Product Detection in a Plasma Beam Under Ultrahigh Vacuum"; Smith et al.; J. Electrochem. Soc.; vol. 129, No. 9, pp. 2045-2051.

"RF—Excited Molecular Jet Plasma for Reactive Ion Etching"; Rev. Sci. Instrum. 62 (10); Oct. 1991; pp. 2356–2362; Jones et al.

"Superhigh—Rate Plasma Jet Etching of Silicon"; Bárdos et al.; Appl. Phys. Lett. 55 (16); Oct. 1989; pp. 1615–1617.

"Anisotropic and Damageless Etching of Single Crystal Silicon Using Chlorine Trifluoride Molecular Beam"; J. Vac. Sci. Tech. Bio (1); Jan./Feb. 1992, Saito et al; pp. 175–178.

G. Liu et al., "Polycrystalline silicon thin film transistors on Corning 7059 glass substrates using short time, low-temperature processing," Appl. Phys. Lett. 62(20), May 17, 1993, pp. 2554–2556.

G. Liu et al., "Selective area crystallization of amorphous silicon films by low–temperature rapid thermal annealing," Appl. Phys. Lett. 55(7), Aug. 14, 1989, pp. 660–662.

Primary Examiner—R. Bruce Breneman
Assistant Examiner—George Goudreau
Attorney, Agent, or Firm—Sixbey, Friedman, Leedom & Ferguson; Gerald J. Ferguson, Jr.; Jeffrey L. Costellia

[57] ABSTRACT

In producing a semiconductor device having GOLD structure, a conductive film containing mainly silicon, tungsten, or/and molybdenum is etched by anisotropic etching using halogen fluoride (such as ClF, ClF$_3$, BrF, BrF$_3$, IF, and IF$_3$) as an etching gas, without producing plasma. In this anisotropic etching, a chamber is maintained to obtain a high vacuum state. Molecular beams of halogen fluoride generated by an evaporator is irradiated into the substrate in a vertical direction (right angle) substantially to the substrate, in order to increase the degree of vertical etching to the substrate than that of horizontal etching. The halogen fluoride are excited by using the RF coil and the RF power source to promote etching.

28 Claims, 5 Drawing Sheets

RF Power Source

METHOD FOR ANISOTROPIC ETCHING CONDUCTIVE FILM

BACKGROUND OF THE INVENTION

1. Field of the Invention

The present invention relates to a method for producing semiconductor integrated circuits, and to a method for anisotropic etching a conductive film having silicon, molybdenum, or tungsten at 95% or more of the composition. The conductive film may be a single-layered or multilayered one formed from silicon (in the single crystalline, polycrystalline, or amorphous state), tungsten silicide, or molybdenum silicide. In particular, The present invention relates to etch such a conductive film without producing substantially plasma.

2. Description of the Related Art

Recently, a fine patterning for a semiconductor integrated circuit is desired. For example, by reduction in the design rule of an MIS (metal-insulator-semiconductor) the semiconductor device, a steep gradient of field strength between the drain and chapel causes the hot carrier injection. The degradation of characteristics by the reduction in design rule (or the shortening of channel) is generally referred to as a short chapel effect. To suppress this effect, an MIS the field effect transistor having low concentration impurity regions (Lightly doped drains or LDDs) 306 and 307 as shown in FIG. 3 is developed.

In such the device, since the LDDs 306 and 307 in which an impurity concentration is lower than that of source and drain regions 304 and 305 are formed between the source region 304 and a channel forming region and between the drain 305 and the channel forming region, an electric field is decreased, so that the generation of hot carrier can be suppressed.

Figure 3:
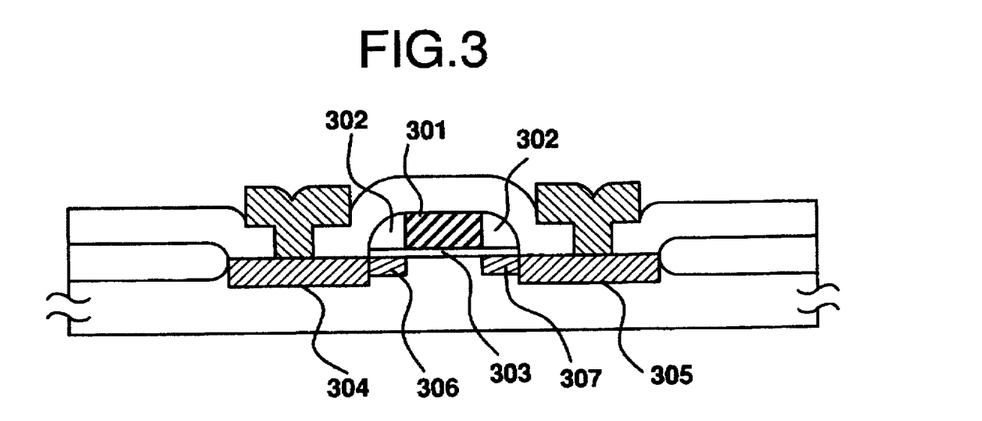
FIG. 3 shows a conventional transistor having the LDD structure.

To form the LDDs 306 and 307 as shown in FIG. 3, after forming a gate electrode 301, the low concentration impurity regions is formed by doping. Then, side walls 302 are formed by using a material such as silicon oxide, and further the source and drain regions 304 and 305 are formed by doping using the side walls as masks in a self-alignment.

Thus, since the gate electrode 301 is not formed above LDDs 306 and 307 and the channel forming region becomes shorter, hot carriers is trapped in the gate insulating film 303 formed on the LDDs 306 and 307. The trapping the hot carriers (especially hot electrons) reverses the conductivity type of the LDD 306 and 307, so that the short channel effect such as fluctuation of a threshold value, increase in a subthreshold factor, and decrease in punch-through withstanding voltage, cannot be prevented.

To solve the above problems, there has been proposed the overlapped LDD structure (GOLD structure) in which the gate electrode covers the LDDs. This structure prevents the characteristics from being degraded by the trapping of hot carriers in the gate insulating film formed on the LDDs.

In the MIS type field effect transistor having a GOLD structure which has been reported, a transistor having an IT-LDD structure (T. Y. Huang: IEDM Tech. Digest 742 (1986)). In the transistor having the IT-LDD structure, a gate electrode is in the form of inverted T. The producing method is schematically shown in FIGS. 6A to 6E.

Figure 6A:
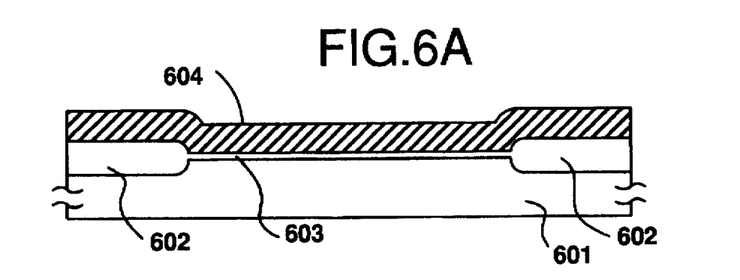
FIGS. 6A to 6E show the steps of fabricating a conventional transistor having the IT-LDD structure.

After a field insulator 602 and a gate insulating film 603 are formed on a semiconductor substrate 601, a conductive film 604 of polycrystalline silicon or the like is formed. (FIG. 6A)

Figure 6B:
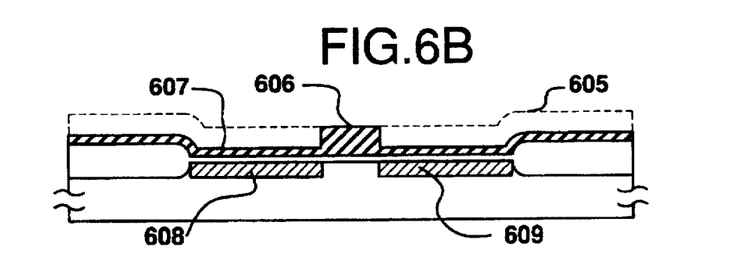

The conductive film 604 is etched selectively to form the gate electrode 606. What is important is the way of etching. That is, etching should not be performed on the entire conductive film 604 but should be performed on only a portion 605 (indicated by dotted line) of the conductive film 604. Thus, the gate electrode 606 remains unetched and a thin conductive film (100 to 1000 Å thick) 607 is formed around the gate electrode 606. This etching is extremely difficult. Thickness variation of the thin conductive film 607 in the same substrate or among substrates) leads to the fluctuation of impurity concentration in the source and drain regions, so that the characteristics of transistors are different from one another. LDDs 608 and 609 are formed by doping via the thin conductive film 607 and the gate insulating film 603. (FIG. 6B)

Figure 6C:
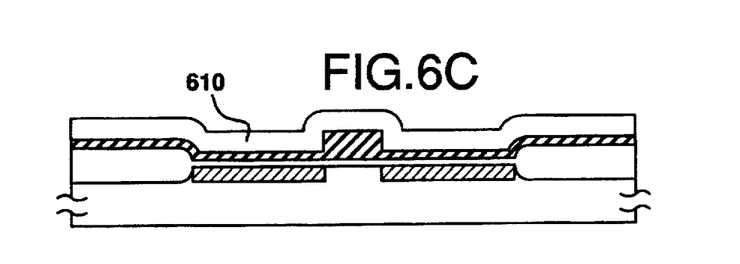

Then a film 610 is formed on the entire surface by using a material such as silicon oxide. (FIG. 6C)

Figure 6D:
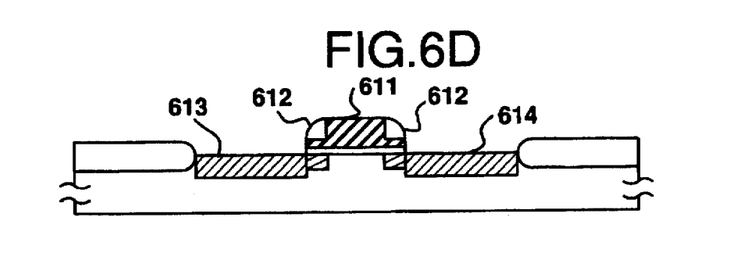

The film 610 is anisotropically-etched (in the same manner as employed in production of the conventional LDD structure), so that the side walls 612 are formed. As the result of this etching, the thin conductive film 607 is etched. To form the source 613 and the drain 614, the formed side walls are used as a mask for doping in the self-alignment. (FIG. 6D)

Figure 6E:
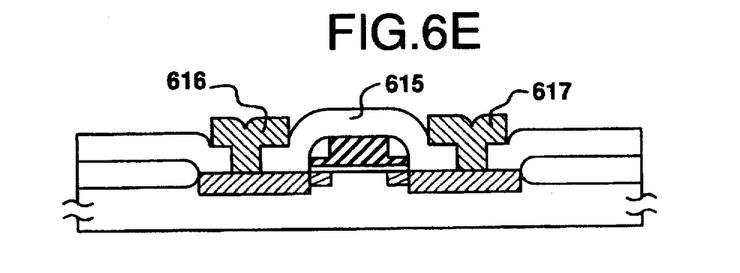

By forming an interlayer insulator 615, a source electrode wiring 616, and a drain electrode wiring 617, the MIS type field effect transistor is completed. (FIG. 6E)

As can be seen from the figures, since the gate electrode has the shape of inverted T, the structure is called IT-LDD structure. In the IT-LDD structure, the thin portion of the gate electrode is present above the LDD and hence it is possible to control to some extent the carrier density on the surface of the LDD by the gate electrode. This prevents the interconductance from decreasing due to serial resistance of the LDD and also prevents the device characteristics from fluctuating due to hot carriers injected into the insulating film on LDD although the concentration of impurities in the LDD is reduced further.

The above advantage is not inherent in an IT-LDD structure but is common to all GOLD structures. The GOLD structure makes it possible to reduce the concentration of impurities in the LDD. This produces a marked effect of decreasing an electric field. Also, the GOLD structure makes it possible to shallowly form the LDD. This suppresses the short channel effect and punch through.

The only effective way of producing the GOLD structure is a producing method of the IT-LDD structure. Despite its many advantages, it is extremely difficult to form the IT-LDD structure. In particular, it is difficult to control anisotropic etching (etching performed selectively in the vertical direction) of the conductive film shown in FIG. 6B.

For requirements for fine-patterned semiconductor integrated circuits, a variety of dry etching methods have developed. Anisotropic etching is further desired by increasing an aspect ratio (vertical-to-horizonal ratio). Fine patterning is necessary for fabrications of the semiconductor substrate, the Gate electrode wiring and. underlayer wirings. These wirings are made of silicon, tungsten, molybdenum. or these silicides. Thus, it is necessary to establish a technique for anisotropic etching these materials.

In the conventional common anisotropic etching process, active nuclei of fluorine are produced by ionizing a fluoride gas such as $CF_4$ or $SF_6$ by plasma and then reacted with silicon, molybdenum, or tungsten, thereby converting them into volatile silicon fluoride, molybdenum fluoride and tungsten fluoride which are removed. However, a disadvantage of this anisotropic etching process is the possibility that carbon and sulfur contained in the etching gas react with silicon and the reaction products enter the semiconductor element. Another disadvantage is the adhering of teflon-like polymer to the inner wall of the etching chamber after processing for a long period of time.

There is still another disadvantage that the etching process needs a plasma which causes plasma damages to the semiconductor elements, adversely affecting their reliability.

Halogen fluoride, i.g., a substance (such as ClF, ClF$_3$, BrF, BrF$_3$, IF, and IF$_3$) represented by formula XF$_n$ (where X denotes halogen other than fluorine and n is an integer) is known as an etching gas for a material containing mainly silicon, molybdenum or tungsten. Since this has extremely strong fluorinating action, etching (gas etching) can be performed without producing active nuclei by plasma. However, since anisotropy cannot be provided in the ordinary gas etching, it is difficult to perform anisotropic etching.

SUMMARY OF THE INVENTION

The object of the present invention is to solve the above problems. That is, the object of the present invention is to provide a method for performing anisotropic etching by using a halogen fluoride as an etching gas without producing substantially plasma. Hence, this method eliminates the possibility of entering undesirable elements (such as carbon and sulfur) contaminating silicon semiconductor into a device. In addition, this process permits the easy maintenance of the etching chamber. Further, by this process plasma damage for semiconductor elements is decreased, thereby improving their reliability.

According to the present invention, a conductive film is anisotropically-etched by irradiating a molecular beam of halogen fluoride into a processing substrate at an approximately perpendicular incident angle. The conductive film is composed of silicon, molybdenum, or tungsten, whose total amount exceeds 95% of the composition.

In the present invention, the halogen fluoride may be any one of ClF, ClF$_3$, BrF, BrF$_3$, IF, and IF$_3$. The process may be carried out more effectively if the molecular beam of halogen fluoride is activated by radio frequency excitation or if a processing substrate is heated to 50° to 500° C.

If the present invention is to be applied to fabrication of a semiconductor having GOLD structure, it is recommended that the side walls be formed from a conductive material composed mainly of silicon (whose purity exceeds 95%). To be more specific, in order to form side walls as a portion of the gate electrode, a conductive film having a silicon-based material is formed to cover the center portion of the gate electrode. Then, anisotropic etching is performed with a molecular beam of RF-excited halogen fluoride, thereby forming the gate electrode. When an impurity ion is implanted using the gate electrode as a mask, thereby obtaining the GOLD structure in the self-alignment.

The molecular beam of halogen fluoride is generated by causing halogen fluoride to flow in a chamber kept at a high vacuum of $10^{-3}$ torr or lower, preferably $10^{-5}$ torr or lower. Etching apparatuses are shown in FIGS. 1A and 1B.

Figure 1A:
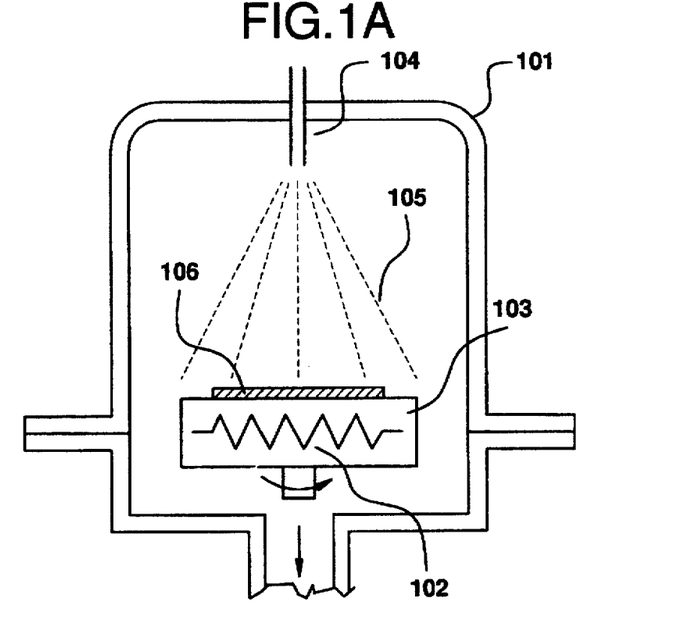
FIGS. 1A and 1B are schematic diagrams of the etching apparatus used in the present invention.

In FIG. 1A, a nozzle 104 for injecting a halogen fluoride gas is provided on a chamber 1. A substrate holder 103 for holding a substrate 106 is provided in an injecting direction of the nozzle 104. The substrate holder 103 is capable of rotation and is provided with a heater 102. An exhaust system is provided to obtain a vacuum state in the chamber 101. A plurality of nozzles are provided although only one nozzle 104 is shown. To generate the molecular beam 105 of halogen fluoride, the chamber 101 is sufficiently evacuated to obtain high vacuum state and then the nozzle 104 is opened to jet out halogen fluoride.

Figure 1B:
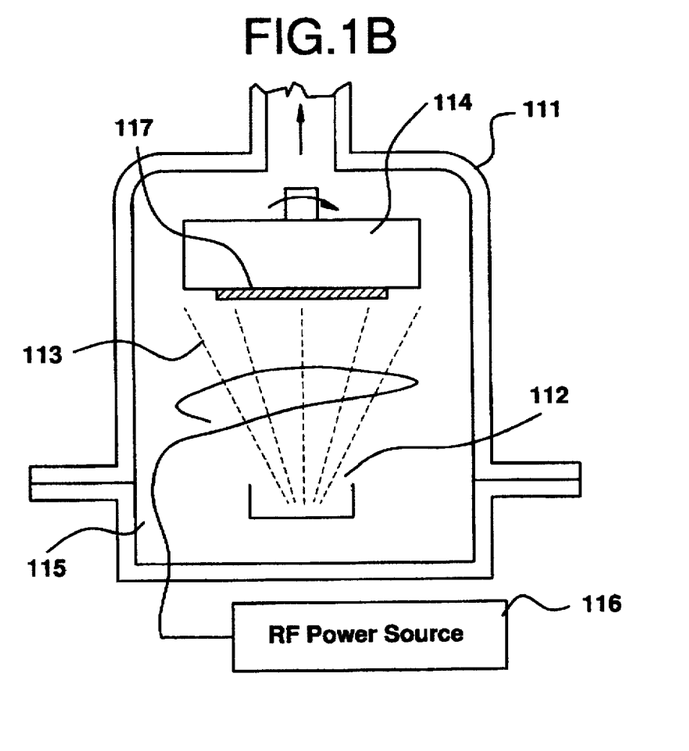

In FIG. 1B, an evaporator 112 having a solid halogen fluoride is provided in the chamber 111. On the evaporator 112, an RF coil 115 connected to an RF power source 116 is provided. Further on the RF coil, a substrate holder 114 for holding a substrate 117 is provided to face the evaporator 112. The substrate holder 114 is capable of rotation. An exhaust system is provided to obtain a vacuum state in the chamber 111.

After the substrate holder 114 and the substrate 117 are placed in the chamber 111, the chamber 111 is sufficiently evacuated to obtain a high vacuum state. Then the halogen fluoride (haloid fluoride) is evaporated spontaneously or forcibly from the evaporator 112, so that the molecular beam 113 of halogen fluoride is generated. The evaporator for a halogen fluoride having a high melting point and boiling point should be kept at an adequate low temperature.

In the apparatuses of FIGS. 1A and 1B, it is possible to control etching by placing a shutter to interrupt the molecular beam between the substrate and the evaporator. Also, it is possible to promote etching action by heating the substrate by the heater 102. The similar effects may be obtained by exciting the molecules of halogen fluoride by the RF coil 115 and the RF power source 116.

Figure 2A:
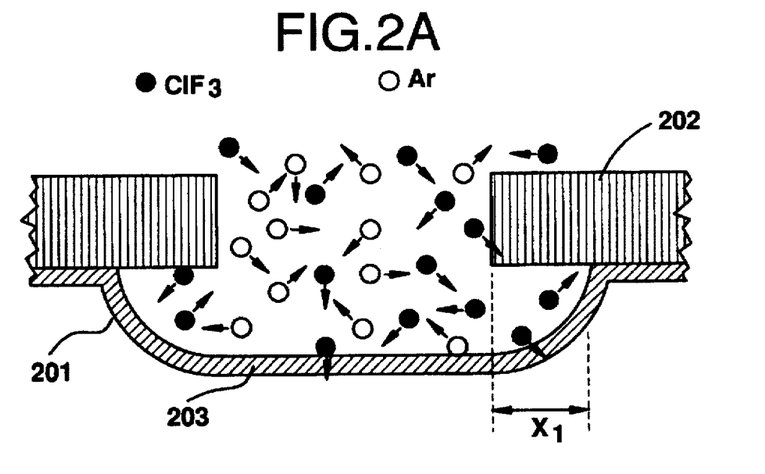
FIGS. 2A and 2B show the etching mechanism according to the present invention.

The anisotropic etching by molecular beams is based on the principle explained below. The ordinary gas etching is performed in a higher pressure (a few torr). Under such condition, the mean free paths of halogen fluoride molecules is about a few μm and their incident angle to an etching material 201 is not uniform. Thus, the molecules of halogen fluoride proceed around behind an resist mask 202, so that an etching surface 203 expands isotropically from the opening of the mask 202, as shown in FIG. 2A.

Figure 2B:
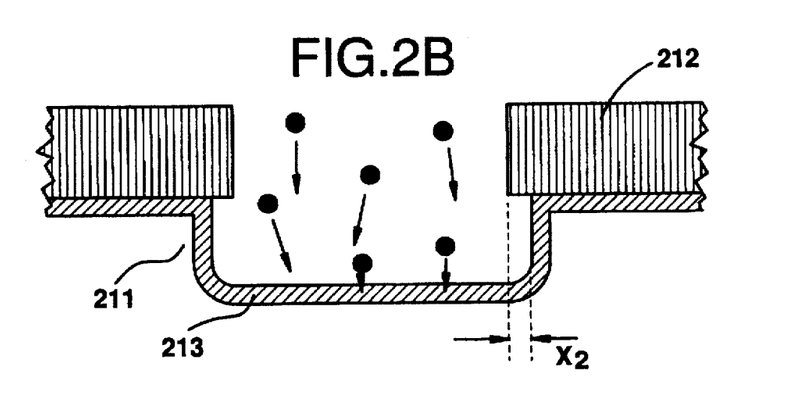

If the molecules of halogen fluoride have sufficiently long mean free paths, their incident angle would be approximately perpendicular to the etching material 211, as shown in FIG. 2B, and hence etching action behind the mask 212 is extremely low. Thus, the etching surface 213 is nearly equal in size to the opening of the mask 212.

In operating the apparatuses of FIGS. 1A and 1B, it is not necessary that parallel molecular beams from the nozzle or evaporator be irradiated into a processing substrate at a right incident angle. What is important is that the incidence of molecular beams is approximately normal to the surface of a processing substrate. Thus, it is necessary that a distance between the processing substrate and the nozzle or evaporator be sufficiently long. To travel molecules over such a long distance without collisions, it is necessary that the chamber be kept at a high vacuum so that the mean free paths of molecules are extended.

Anisotropic etching for the substrate may be made more uniform by rotating the substrate. Planetary rotation is especially effective.

The incident molecules of halogen fluoride bring about chemical reactions on the surface of an etching material. At the same time, they also is elastically or inelastically scattered (excluding chemical reaction). In the elastical scattering, they are reflected in the direction opposite to the incidence, whereas in the inelastical scattering, they may be reflected in the sideward direction. Thus, it is quite impossible to eliminate sideward etching completely. However, under adequate condition, vertical etching may advance 2 to 10 times as rapidly as horizontal etching.

In FIG. 1A, since a large number of halogen fluoride molecules jet out at once from the nozzle 104, the molecule distances between halogen fluorides molecules are short and the mean free paths of molecules are also short accordingly. As a result, anisotropy of etching is decreased. By contrast, in the apparatus of FIG. 1B, since the molecule distances between halogen fluorides are long, anisotropy of etching is high. However, this represents an insufficient supply of substances required for chemical reactions (or etching). This leads to a slow etching rate.

Anisotropy of etching may be decreased by heating a processing substrate. This is because inelastic scattering is generated between halogen fluorides and a processing surface and sideward etching is progressed. By contrast, anisotropy of etching is increased if the temperature of a processing substrate is low. However, if the temperature is low, a kind of halogen fluoride which is usable in chemical reaction is decreased. This results in a slow etching rate.

For those reasons mentioned above, exciting of halogen fluoride by radio frequency is effective in increasing the etching rate without decreasing anisotropy of etching.

DETAILED DESCRIPTION OF THE PREFERRED EMBODIMENTS

Example 1

In this example shown in FIGS. 4A to 4E, the etching process of the present invention is applied to fabrication of a field effect transistor of the GOLD structure.

Figure 4A:
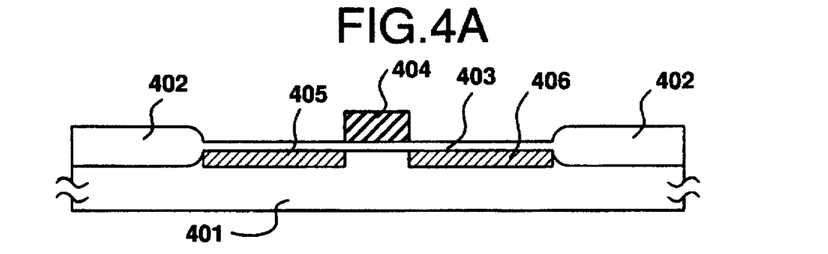
FIGS. 4A to 4E show the steps of producing a transistor having the GOLD structure according to Example 1.

A field insulator 402 (3000 Å to 1 μm thick) is formed on a silicon substrate 401 by the known LOCOS forming method. A silicon oxide film (100 to 500 Å thick) is formed as a gate insulating film 403 by thermal oxidation. A polycrystalline silicon film (2000 to 5000 Å thick) having its conductivity increased by doping with phosphorus is deposited by thermal CVD. It is etched to form the central portion 404 of the gate electrode.

Using the central portion 404 of the gate electrode as a mask, phosphorus ions are implanted in the self-alignment to form low concentration N-type impurity regions (referred to as lightly doped drains or LDDs hereinafter) 405 and 406. The concentration of phosphorus in the LDDs 405 and 406 is preferably $1 \times 10^{16}$ to $1 \times 10^{17}$ atoms/cm$^3$, and the depth of the LDD preferably 300 to 1000 Å. (FIG. 4A)

A polycrystalline silicon film 407 (2000 Å to 1 μm thick) having its conductivity increased by doping with phosphorus is formed by thermal CVD. (FIG. 4B)

Anisotropic etching with ClF$_3$ is performed in the apparatus of FIG. 1A. On the chamber 101, the nozzle 104 for jetting out a halogen fluoride gas is provided. The substrate holder 103 for holding the substrate 106 is provided in the jet direction of the nozzle 104. The substrate holder 103 is capable of rotation and is provided with a heater 102. A plurality of nozzles may be provided.

Figure 4B:
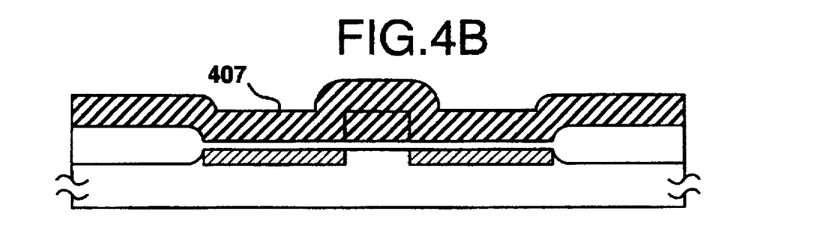

The substrate 106 in FIG. 4B is held to the substrate holder 103. The substrate 106 is heated by the heater 102 at 200° to 300° C. and then etched by using ClF$_3$ introduced into the chamber 101 from the nozzle 104 while rotating. The flow rate of ClF$_3$ is 0.5 sccm, and the pressure in the vicinity of the substrate 106 is 1 to $5 \times 10^{-4}$ torr.

Figure 4C:
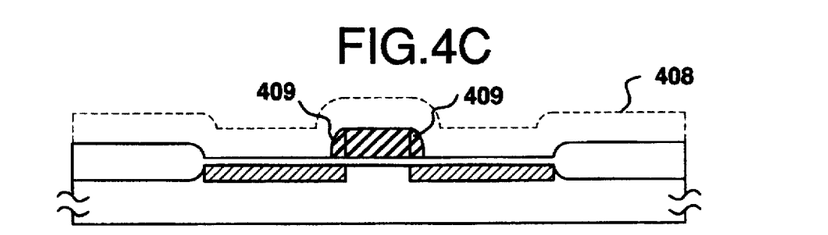

Thus, a portion (indicated by a dotted line) 408 of the polycrystalline silicon film 407 is etched to form side portions 409 of the gate electrode, the so-called side walls, in side surfaces of the central portion 404 of the gate electrode. In the etching condition in this example, the etching rate in the vertical direction is approximately twice than that in the horizontal direction. In other words, etching in this example is not complete anisotropic etching. Therefore, the side portions 409 of the gate electrode are slightly narrower than that Obtained by complete anisotropic etching. Etching is stopped in the gate insulation film 403, and overetching is not observed. (FIG. 4C)

The portion (301 in FIG. 3) corresponding to the gate electrode in the conventional LDD structure is called the central portion of the gate electrode in the sense that it is not all of the gate electrode. The portions (302 in FIG. 3) corresponding to the side walls of the conventional LDD structure are called side walls as well as side portions of the gate electrode because, in the present invention, it is regarded as a portion of the gate electrode formed from a silicon-based conductive material.

Figure 4D:
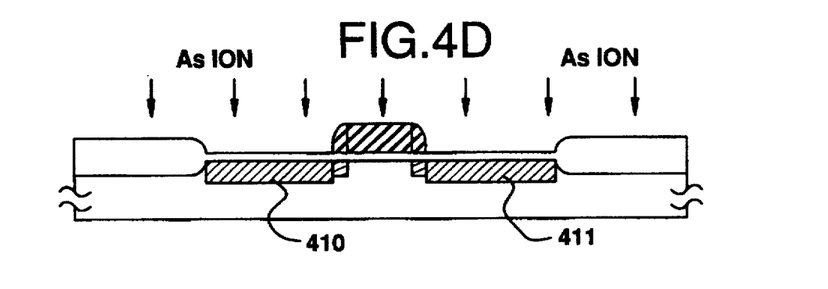

Using the central portion 404 and the side portions 409 of the gate electrode as masks, the doping of arsenic is carried out by ion implantation in the self-alignment, to form the source 410 and the drain 411. The concentration of arsenic is $1 \times 10^{19}$ to $5 \times 10^{20}$ atoms/cm$^3$. By thermal annealing, recrystallization in the LDDs 405 and 406 and the source and drain regions 410 and 411 is performed. (FIG. 4D)

Figure 4E:
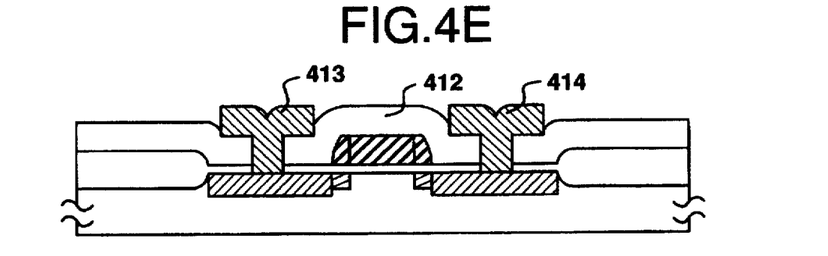

A silicon oxide film 412 (3000 Å to 1 μm thick) as the interlayer insulator is deposited by thermal CVD. Contact holes are formed and then a source electrode 413 and a drain electrode 414 are formed. Thus, a transistor of GOLD type can be produced. (FIG. 4E)

Example 2

In this example shown in FIGS. 5A to 5E, the etching process of the present invention is applied to fabrication of a field effect transistor of the GOLD structure.

Figure 5A:
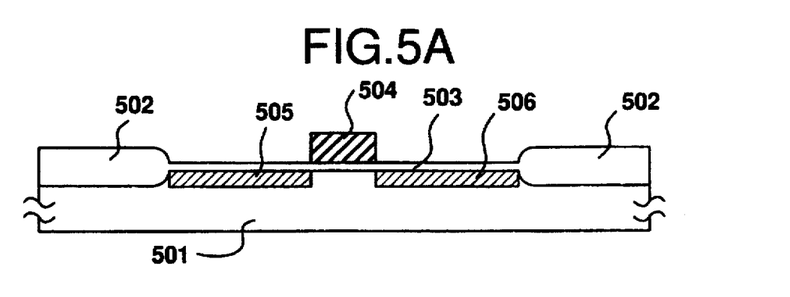
FIGS. 5A to 5E show the steps of producing a transistor having the GOLD structure according to Example 2.

A field insulator 502 (3000 Å to 1 μm thick) is formed on a silicon substrate 501. On the field insulator 502, a silicon oxide film (100 to 500 Å thick) is formed as an gate insulating film 503 by thermal oxidation. Using a polycrystalline silicon film (2000 to 5000 Å thick) having its conductivity increased by doping with phosphorus, a central portion 504 of the gate electrode is formed. Using the central portion 504 as a mask, phosphorus is ion-implanted in the self-alignment to form the LDDs 505 and 506 of N-type. (FIG. 5A)

Figure 5B:
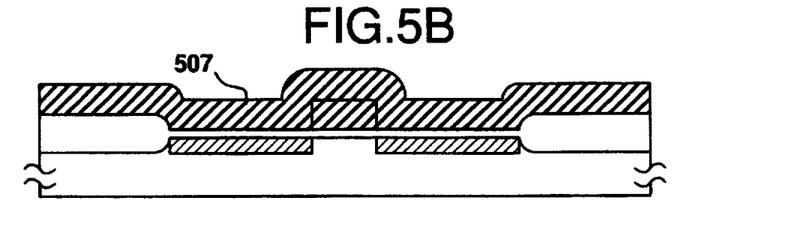

A polycrystalline silicon film 507 (2000 Å to 1 μm thick) having its conductivity increased by doping with phosphorus is formed by thermal CVD. (FIG. 5B)

Then, anisotropic etching with ClF$_3$ is performed in the apparatus of FiG. 1B. In this apparatus, the evaporator 112 having solid halogen fluoride is provided in the chamber 111. Above the evaporator 112, the RF coil 115 connected to the RF power source 116 is provided. The substrate holder 114 for holding the substrate 117 is provided further above to face the evaporator 112. The substrate holder 114 is capable of rotation. The exhaust system is provided to obtain a vacuum state in the chamber 111.

The substrate 117 and the substrate holder 114 are placed in the chamber 111. With the chamber sufficiently evacuated to obtain a high vacuum state, solid $ClF_3$ is evaporated from the evaporator 112 so that molecular beams 113 are generated. The $ClF_3$ are excited by using the RF coil 115 and the RF power source 116 to promote etching.

The following equation defines the vapor pressure P (torr) of $ClF_3$. That is, $$\log_{10} P = 7.361 - 1097/(t+233)$$

where t represents a temperature (°C.).

It is clear that the temperature of the vapor process should be −144° C. if P is to be $1 \times 10^{-5}$ torr. In actual, this vapor pressure is achieved at −80° C.. The evaporator 112 having $ClF_3$ is cooled with dry ice. The pressure in the vicinity of the substrate 117 is maintained at 1 to $5 \times 10^{-6}$ torr because the chamber is kept at a vacuum state.

Anisotropy of etching (the ratio of vertical etching to horizontal etching) is as high as 10:1 (2:1 in Example 1). It should be noted that the excitation using RF application does not cause the ionization of $ClF_3$ molecules.

Figure 5C:
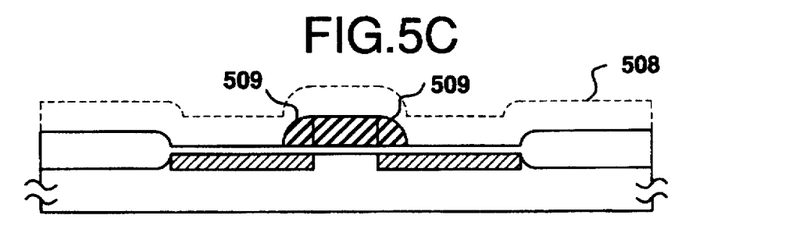

As the result, the polycrystalline silicon film 507 is etched (a portion 508 indicated by a dotted line is an original polycrystalline silicon film), side portions (side walls) 509 of the gate electrode is formed in side surfaces of the central portion of the gate electrode. (FIG. 5C)

Figure 5D:
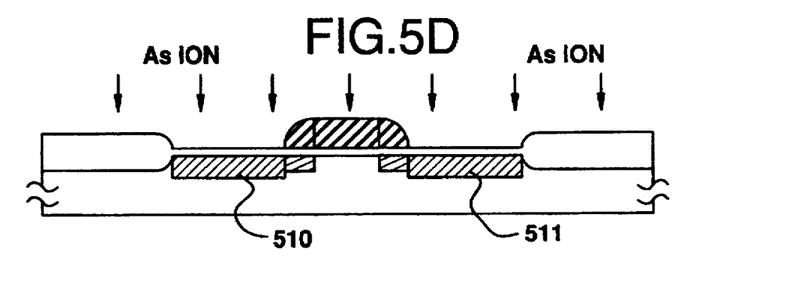

Using the central portion 504 and the side portions 509 of the gate electrode as masks, the doping of arsenic is carried out in the self-alignment by ion implantation. Thus, a source 510 and a drain 511 are formed. By the thermal annealing, recrystallization in the LDDs 505 and 506 and the source and drain regions 510 and 511 is performed. (FIG. 5D)

Figure 5E:
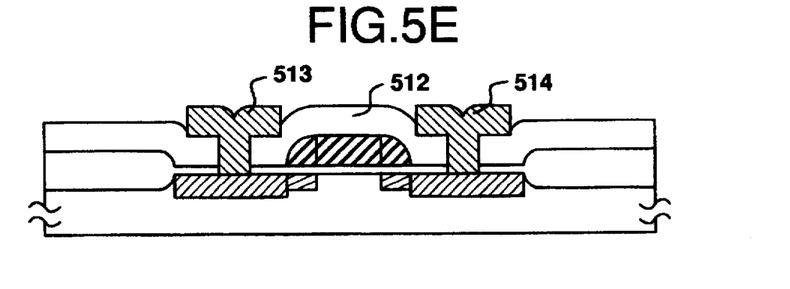

A silicon oxide film (3000 Å to 1 μm thick) is deposited as an interlayer insulator 512. Contact holes are formed and then a source electrode 513 and a drain electrode 514 are formed, so that a GOLD type transistor can be produced. (FIG. 5E)

Although the above examples have demonstrated to produce a field effect transistor of GOLD structure, the present invention can be effectively applied to not only those devices formed on a semiconductor substrate but also those devices such as TFTs formed on an insulating substrate.

The present invention is effective in anisotropic etching of a silicon substrate (which is important for semiconductor integrated circuits) as well as anisotropic etching of polycrystalline silicon wirings, tungsten (molybdenum) wirings, or polycide wirings (multi-layered wirings of polycrystalline silicon and tungsten (molybdenum) silicide).

Since etching of the present invention does not yield carbon and sulfur, it does not influence the characteristics of semiconductor devices. Also, although etching is performed for a long period of time, it does not cause adhering of a polymer on the inner wall of the chamber, so that maintenance is easy.

Also, since etching of the present invention is performed without producing plasma, the reliability of the semiconductor elements can be improved. No plasma damage to the lower layer portion such as a semiconductor substrate, a gate electrode, and a wiring is especially favorable. Therefore, the present invention is of great industrial use.

What is claimed is:

1. An anisotropic etching method comprising the steps of:
   producing a molecular beam of halogen fluoride in a chamber; and
   irradiating the molecular beam of halogen fluoride in a substantially perpendicular direction to a substrate on which a conductive film is formed to give priority to etching of the conductive film in a vertical direction,
   wherein the molecular beam of the halogen fluoride is excited by RF.

2. The method of claim 1 wherein the conductive film includes one of silicon, tungsten, and molybdenum at 95% or more of a composition.

3. The method of claim 1 wherein the halogen fluoride includes one of ClF, $ClF_3$, BrF, $BrF_3$, IF, and $IF_3$.

4. The method of claim 1 wherein the conductive film includes one of tungsten silicide and molybdenum silicide.

5. The method of claim 1 wherein the substrate is rotated during anisotropic etching.

6. An etching method comprising the step of anisotropically etching a conductive film by using a halogen fluoride as an etching gas, wherein the anisotropic etching step including the steps of,
   producing a molecular beam of halogen fluoride, and
   irradiating the molecular beam of halogen fluoride in a direction substantially perpendicular to a substrate on which a conductive fill is formed,
   wherein the molecular beam of the halogen fluoride is excited by RF.

7. The method of claim 6 wherein the conductive film includes one of silicon, tungsten, and molybdenum at 95% or more of a composition.

8. The method of claim 6 wherein the halogen fluoride includes one of ClF, $ClF_3$, BrF, $BrF_3$, IF, and $IF_3$.

9. The method of claim 6 wherein the conductive film includes one of tungsten silicide and molybdenum silicide.

10. The method of claim 6 wherein the substrate is rotated during anisotropic etching.

11. An etching method comprising the steps of:
    forming a conductive fill on a substrate;
    placing in a chamber the substrate on which the conductive film is formed;
    obtaining a vacuum state in the chamber;
    jetting out halogen fluoride to produce a molecular beam of the halogen fluoride in the chamber which is in the vacuum state; and
    irradiating the molecular beam of the halogen fluoride in a direction substantially perpendicular to the substrate to anisotropically etch the conductive film,
    wherein the molecular beam of the halogen fluoride is excited by RF.

12. The method of claim 11 wherein the conductive film includes one of silicon, tungsten, and molybdenum at 95% or more of a composition.

13. The method of claim 11 wherein the halogen fluoride includes one of ClF, $ClF_3$, BrF, $BrF_3$, IF, and $IF_3$.

14. The method of claim 11 wherein the conductive film includes one of tungsten silicide and molybdenum silicide.

15. The method of claim 11 wherein the substrate is rotated during anisotropic etching.

16. An etching method comprising the steps of:
    producing a molecular beam of halogen fluoride in a chamber; and
    irradiating the molecular beam of halogen fluoride in a direction substantially perpendicular to a substrate on which a conductive film is formed to give priority to etching of the conductive film in a vertical direction, so that the conductive film is anisotropically-etched without producing plasma, wherein the molecular beam of the halogen fluoride is excited by RF.

17. The method of claim 16 wherein the conductive film includes on of silicon, tungsten, and molybdenum at 95% or more of a composition.

18. The method of claim 16 wherein the halogen fluoride includes one of ClF, ClF$_3$, BrF, BrF$_3$, IF, and IF$_3$.

19. The method of claim 16 wherein the conductive film includes one of tungsten silicide and molybdenum silicide.

20. The method of claim 16 wherein the substrate is rotated during anisotropic etching.

21. A method of manufacturing a semiconductor device comprising the steps of:

preparing a semiconductor layer;

forming a gate insulating film on the semiconductor layer;

forming a gate electrode on said gate insulating film, said gate electrode having a pair of side faces;

performing a first ion introduction into first portions of said semiconductor layer with said gate electrode used as a first mask to form a first pair of impurity regions;

forming a conductive film over said semiconductor layer and said gate electrode;

performing an anisotropic etching of said conductive film to form a pair of side wall spacers on the side faces of said gate electrode; and performing a second ion introduction into second portions of said semiconductor layer with said gate electrode and said side wall spacers used as a second mask to form a second pair of impurity regions, wherein said anisotropic etching is performed by directing a molecular beam of halogen fluoride toward said conductive film in a direction perpendicular to said semiconductor layer.

22. The method of claim 21 wherein said first pair of impurity regions have a same conductivity type as said second pair of impurity regions.

23. The method of claim 21 wherein phosphorous ions are introduced by said first ion introduction.

24. The method of claim 21 wherein arsenic ions are introduced by said second ion introduction.

25. The method claim 21 wherein said first pair of impurity regions are doped with a smaller concentration of ions than said second pair of impurity regions.

26. The method of claim 21 wherein said halogen fluoride is selected from the group consisting of ClF, ClF$_3$, BrF, BrF$_3$, IF and IF$_3$.

27. The method of claim 21 wherein said conductive film comprises a material selected from the group consisting of silicon, tungsten and molybdenum.

28. The method of claim 21 wherein said molecular beam of said halogen fluoride is excited by RF.

* * * * *